United States Patent [19]

Uehara et al.

[11] Patent Number: 4,550,242

[45] Date of Patent: Oct. 29, 1985

[54] AUTOMATIC PLASMA PROCESSING DEVICE AND HEAT TREATMENT DEVICE FOR BATCH TREATMENT OF WORKPIECES

[75] Inventors: Akira Uehara, Kanagawa; Isamu Hijikata, Tokyo; Hisashi Nakane, Kanagawa; Muneo Nakayama, Tokyo, all of Japan

[73] Assignee: Tokyo Denshi Kagaku Kabushiki Kaisha, Kanagawa, Japan

[21] Appl. No.: 424,287

[22] Filed: Sep. 27, 1982

[30] Foreign Application Priority Data

Oct. 5, 1981 [JP] Japan ............................... 56-159282
Aug. 27, 1982 [JP] Japan ............................... 57-148583

[51] Int. Cl.$^4$ ............................................. B23K 9/00
[52] U.S. Cl. ..................... 219/121 PG; 219/121 PV; 219/121 PD; 414/331; 156/345
[58] Field of Search ................. 219/121 PD, 121 PF, 219/121 PE, 121 PG, 121 PX, 158–160; 414/416, 417, 331, 222, 217, 417, 404; 156/643, 646, 345; 204/192 E, 298, 164

[56] References Cited

U.S. PATENT DOCUMENTS

| | | | |
|---|---|---|---|
| 3,921,788 | 11/1975 | Robertson, Jr. et al. | 414/417 |
| 4,151,034 | 4/1979 | Yamamoto | 219/121 PD |
| 4,222,839 | 9/1980 | Goodner et al. | 156/345 |
| 4,285,800 | 8/1981 | Welty | 156/345 |
| 4,289,598 | 9/1981 | Engle | 204/192 E |
| 4,303,467 | 12/1981 | Scornavacca et al. | 156/345 |
| 4,304,983 | 12/1981 | Pierfederici | 219/121 PG |
| 4,336,438 | 6/1982 | Uehara et al. | 219/121 PD |
| 4,345,968 | 8/1982 | Coe | 156/345 |
| 4,388,140 | 6/1983 | Nakazato et al. | 156/345 |
| 4,412,771 | 11/1983 | Gerlach et al. | 414/417 |

*Primary Examiner*—M. H. Paschall
*Attorney, Agent, or Firm*—Irving M. Weiner; Joseph P. Carrier; John J. Cantarella

[57] ABSTRACT

An automatic plasma processing device having a substantially vertically disposed plasma chamber in which a plurality of semiconductor wafers are processed with plasma simultaneously. The device comprises a container cassette adapted to contain a plurality of wafers therein, a feeding mechanism for feeding the cassette to a predetermined position, a replacing mechanism for taking out the wafers from the cassette placed at the predetermined position, a holding frame operable to receive the wafers from the replacing mechanism and hold the same therein, a driving mechanism for moving the holding frame up and down into and out of the plasma chamber, a plasma generating mechanism for generating plasma in the plasma chamber, and a control system for controlling the aforesaid mechanisms. The automatic plasma processing device has a simplified construction and automatically and successively processes a large number of wafers, while at the same time being compact.

22 Claims, 7 Drawing Figures

AUTOMATIC PLASMA PROCESSING DEVICE AND HEAT TREATMENT DEVICE FOR BATCH TREATMENT OF WORKPIECES

BACKGROUND OF THE INVENTION

1. Field of the Invention

The present invention relates generally to an automatic plasma processing device. More particularly, the invention relates to a vertical automatic plasma processing device having a vertically disposed plasma generating chamber which, is employed for batch-treatment etching, cleaning, ashing, etc., of workpieces in the form of semiconductor wafers as intermediate products during production of chips having large scale integrated circuits such as LSI's and VLSI's formed thereon.

2. Description of Relevant Art

Fine working in the production of chips having a large scale integrated circuit such as an LSI formed thereon includes a process of etching an insulator film, a semiconductor film or a metal film through a resist film having a fine pattern formed on a semiconductor wafer, another process of cleaning such insulator films, etc., and a further process of ashing to remove the resist film from the surface of the wafer.

Conventionally, the aforesaid processes are effected by a so-called "wet type" processing in which various liquid chemicals such as inorganic acids, organic solvents, etc., are used. However, in addition to the problem of disposition of waste liquids in such processing, working accuracy is also unsatisfactory.

Recently, patterns formed on chips have had a tendency to become finer and finer with the development of VLSI's, and such desired fine patterns cannot be attained by a wet type processing such as described above. Accordingly, various dry type plasma processing devices in which plasma is used have been proposed due to the high working accuracy provided thereby. However, substantially all of such plasma processing devices effect only a processing with plasma, and wafers must be loaded into and unloaded from the plasma generating chamber by manual operations exclusively. For example, wafers are taken out one by one from an unprocessed wafer containing cassette and are transferred one by one to a wafer jig made of quartz or aluminum using a pair of tweezers. Consequently, the percentage of available products is very low due to breaks and cracks of wafers, dropping and contamination of wafers from incomplete clamping of same, etc. Such defects become more material as the diameter of the wafers is increased, e.g., recently to five inches and even to six inches. Further, because the wafers are heated to a high temperature during plasma processing, manual operations to take out the wafers after completion of the processing must be avoided, resulting in an extremely low working efficiency.

In order to eliminate the foregoing disadvantages, devices in which wafers are automatically loaded into a chamber (such as, for example, a device disclosed in Japanese Laid-Open Patent No. 53-90870) have also been proposed. Such devices include a horizontally disposed plasma generating chamber. Because such chamber is elongated in its axial direction, the device cannot be made compact and it is impossible to avoid complicating the structure of the device itself.

The present invention effectively overcomes the foregoing problems attendant the conventional techniques described hereinabove.

SUMMARY OF THE INVENTION

The present invention provides an automatic plasma processing device, comprising: at least one cassette member adapted to contain a plurality of semiconductor wafers therein; a feeding mechanism for feeding the cassette member from at least one predetermined position in which it receives the cassette member to a second predetermined position in which the wafers are taken out from the cassette member; an unloading mechanism for taking out the wafers from the cassette member placed at the second position; a holding member operable for receiving the wafers from the unloading mechanism and for holding the wafers therein; a driving mechanism for driving the holding member to move in a substantially vertical direction; a plasma chamber disposed in a substantially vertical direction such that the holding member may be moved substantially in the vertical direction into and out of the plasma chamber; a plasma generating mechanism for generating plasma in the plasma chamber in order to effect plasma processing of the wafers with the plasma thus generated; and a control system for controlling the feeding mechanism, the driving mechanism and the plasma generating mechanism in accordance with a predetermined sequence.

It is an object of the present invention to provide a substantially vertically disposed automatic plasma processing device which automatically processes a large number of wafers simultaneously so as to reduce the time required for the intended processing and to enable the device itself to be compact, while eliminating manual operations.

The above and further objects, details and advantages of the present invention will become apparent from the following detailed description when read in conjunction with the accompanying drawings.

DETAILED DESCRIPTION OF PREFERRED EMBODIMENTS

Figure 1:
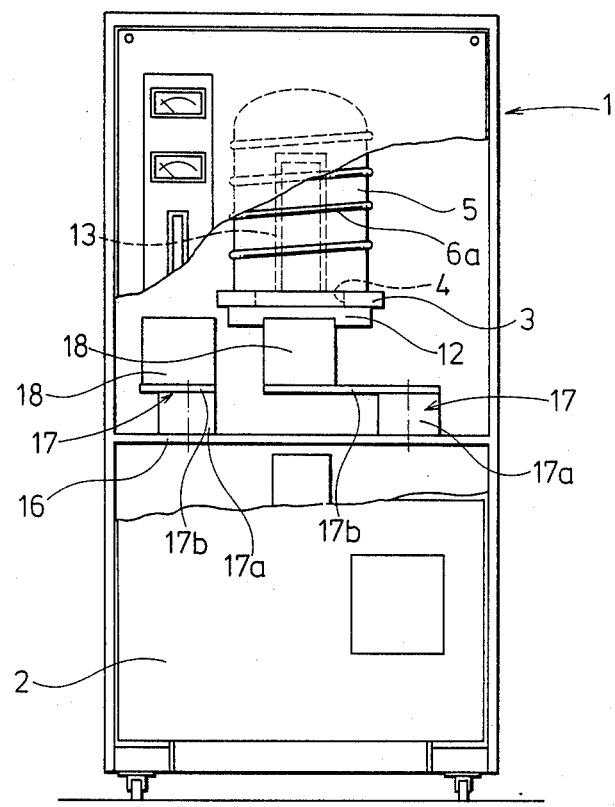
FIG. 1 is a front elevational view of a vertical automatic plasma processing device according to the present invention, partly broken away to show the inside of the device.
Figure 2:
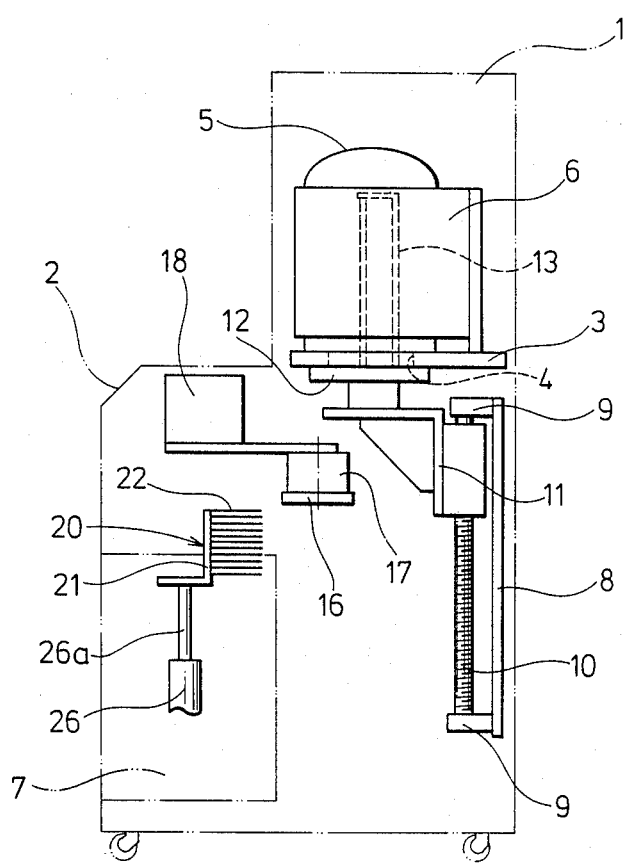
FIG. 2 is a side elevational view showing an inside structure of the device of FIG. 1.

With reference to FIG. 1 through 5, there is illustrated an automatic heat-treatment or plasma processing device which includes a body 1 substantially in the form of a box. The body 1 has an extruding portion or apron 2 formed at a front lower half portion thereof. A support table 3 is securely mounted at an upper position within the body 1, treament chamber or plasma generating chamber 5 for effecting plasma processing therein is secured to the support table 3 such that it covers an opening 4 formed in the support table 3. The chamber 5 is made of quartz and is substantially in the form of a cylinder. The chamber 5 is open at the bottom end thereof and is disposed to have an axis extending substantially in a vertical direction. As shown in FIG. 2, a plasma generating and heating mechanism including an electrode plate 6, a heating coil 6a (FIG. 6), etc., is provided around an outer periphery of the chamber 5 such that a high frequency voltage is applied to the electrode plate 6 from a high frequency power source 7 which is secured to a bottom portion of the apron 2.

If desired, a resistance heating coil or a heating lamp can alternatively be employed as a heating means.

A support plate 8 is securely mounted on an inner wall of the body 1 below the chamber 5 and has a pair of brackets 9 mounted at opposite top and bottom ends thereof. A rod 10 having an external thread formed thereon extends between and is supported by the brackets 9 for rotation about its axis. The rod 10 is rotated by means of a motor (not shown). A table 11 having a substantially inverted L-shaped configuration in a side elevational view is threadedly fitted on the rod 10 so that it may be moved up or down along a guide rod (not shown) by rotation of the rod 10. A lid member 12 is mounted on the table 11 for movement to close the opening 4 of the support table 3. The lid member 12 has a wafer holding frame 13 extending upwardly therefrom which can move into and out of the chamber 5 through the opening 4.

Figure 3:
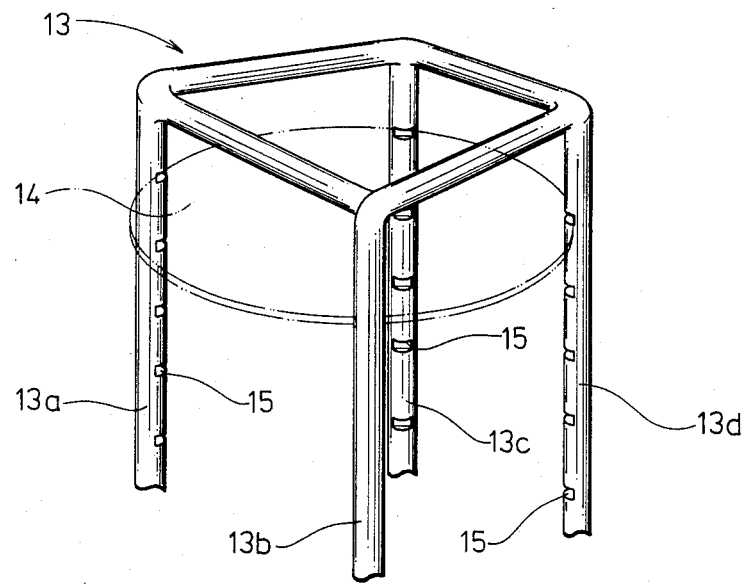
FIG. 3 is a perspective view showing an upper part of a wafer holding frame.

As shown in FIG. 3, the holding frame 13 includes four rods 13a, 13b, 13c and 13d having top ends thereof connected to each other. These rods are arranged such that the distance between the two forwardly positioned rods 13a, 13b is greater than the distance between the two rearwardly positioned rods 13c, 13d so that the holding frame 13 presents as a whole a substantially trapezoidal configuration in plan. The rods 13a, 13b, 13c, 13d each have a plurality of grooves or slits 15 formed in an equidistant relationship substantially in a vertical row along an inner face thereof and adapted to have a peripheral portion of a wafer 14 fitted therein in order to support the wafer 14 on the rods 13a, 13b, 13c, 13d.

When the rod 10 is rotated to move the table 11 upwardly to a predetermined upper limit position, the lid member 12 closes the opening 4 in the support table 3 and the holding frame 13 extends into the chamber 5 through the opening 4. On the contrary, when the table 11 is moved down to a predetermined lower limit position, the holding frame 13 is entirely moved down out of the chamber 5.

As shown in FIG. 1, a support plate 16 is mounted on a mid portion of the body 1 and extends in a substantially horizontal direction. A pair of feeding members 17 are provided on left and right portions of an upper face of the support plate 16. Each feeding member 17 includes a base section 17a adapted to pivot in parallel relationship relative to the support plate 16, and an arm section 17b having an end on which a cassette 18 for containing wafers therein is to be placed.

Figure 4:
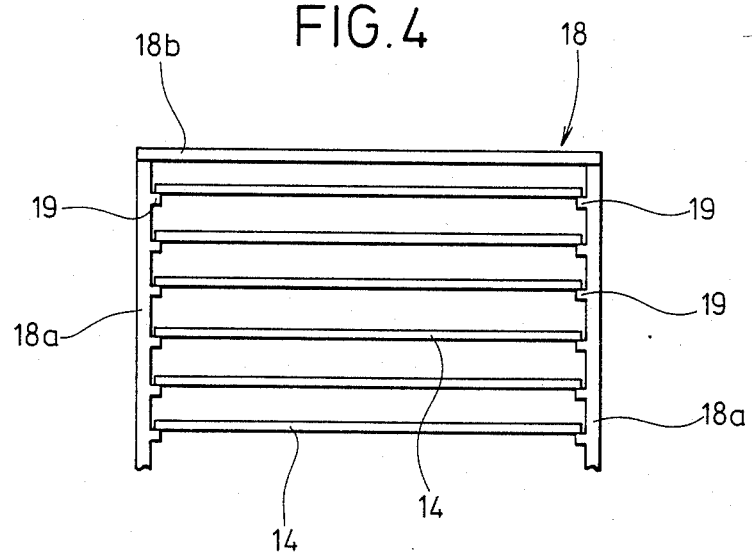
FIG. 4 is a front elevational view showing a cassette having wafers contained therein.
Figure 5:
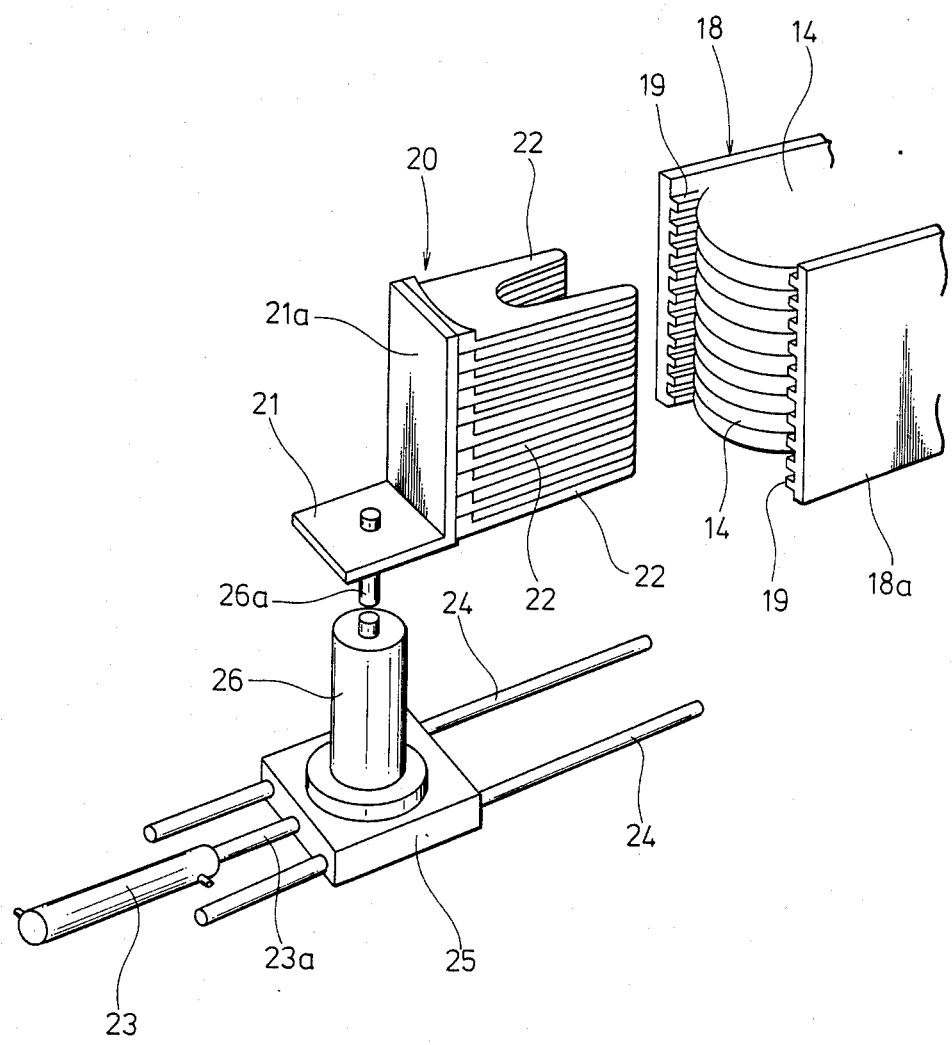
FIG. 5 is a perspective view illustrating a relationship between a replacing member and the cassette.

The cassette 18 includes, as shown in FIG. 4, two opposed plate members 18a made of a material such as aluminum and Teflon, and bar members 18b connecting top ends of the plate members 18a to each other. Each of the plate members 18a has a plurality of horizontal ribs 19 formed in an equidistant relationship in a substantially vertical direction on an inner surface thereof such that a wafer 14 may be supported at opposite edges thereof on upper faces of a pair of opposing ribs 19 of the plate members 18a, to thereby enable a large number of wafers 14 to be contained in a stepped manner within the cassette 18.

As shown in FIG. 2, a replacing member 20 is disposed in the body 1 below each of the feeding members 17. The replacing member 20 includes, as particularly shown in FIG. 5, an angle piece 21, and a plurality of tongues 22 each having a bifurcated end and being securely mounted on a rear face of an upright portion 21a of the angle piece 21 successively in a substantially vertical row. A first cylinder unit 23 is secured to the bottom wall of the body 1, and two guide rods 24 are provided which extend in parallel relationship with a piston rod 23a of the cylinder unit 23. A support table 25 is mounted for sliding motion on the guide rods 24 and is securely connected to an end of the rod 23a of the cylinder unit 23. The support table 25 has a second cylinder unit 26 uprightly mounted thereon which has a piston rod 26a having an end to which a base section of the angle piece 21 of the replacing member 20 is securely connected. Thus, the replacing member 20 is moved in a forward or rearward direction within the body 1 by operation of the first cylinder unit 23 and is also moved in an upward or downward direction by operation of the second cylinder unit 26.

The vertical automatic plasma processing device having a structure as described hereinabove operates in the following manner.

First, a cassette 18 having a batch of wafers contained therein is placed from above the apron 2 onto the ends of the arm pieces 17b of the feeding members 17 in a position wherein the plate members 18a of the cassette 18 are parallel with the front wall of the body 1, as shown in FIG. 2.

Subsequently, a motor incorporated in the body 1 is energized to rotate the rod 10. By such rotation, the table 11 is moved down, whereupon the holding frame 13 uprightly mounted on the table 11 is integrally moved down and entirely taken out or removed from the chamber 5. At the same time, a driving mechanism (not shown) is operated to rotate the arm piece 17b of one of the feeding members 17 by an angle of substantially 90°. As a result, the cassette 18 comes to a position adjacent an upper half of the holding frame 13 such that an opening defined between the plate members 18a of the cassette 18 is opposed to an opening defined between the rods 13a, 13b of the holding frame 13.

Next, the second cylinder unit 26 is operated to lift the replacing member 20 until the tongues 22 thereof are positioned intermediately between the wafers 14 contained in the cassette 18. Relative positions of the pertaining parts are shown in FIG. 6.

In this condition, the first cylinder unit 23 is now brought into operation to move the replacing member 20 in the rearward direction, i.e., in the rightward direction in FIG. 2. Thereupon, the uppermost one of the tongues 22 of the replacing member 20 enters between the first and second uppermost ones of the wafers 14 in the cassette 18 while the remaining tongues 22 enter between the respective corresponding wafers 14. When this condition is reached, operation of the first cylinder unit 23 is stopped by means of a limit switch (not shown). The second cylinder unit 26 is then brought into operation to slightly lift the replacing member 20 whereby the wafers 14 are raised by the tongues 22 of the replacing member 20.

Figure 6:
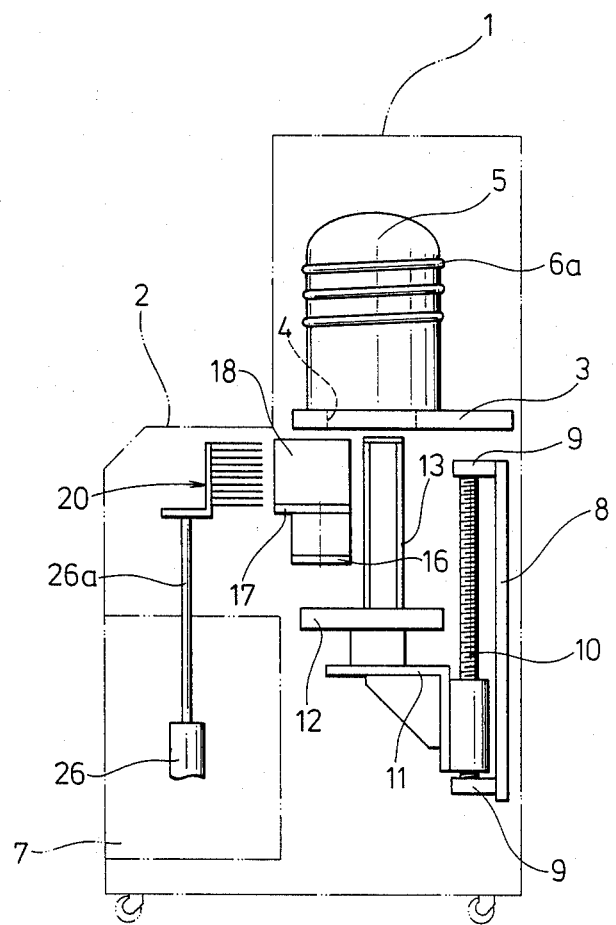
FIG. 6 is a side elevational view similar to FIG. 2, illustrating various parts in respective operative positions.

Thus, if the wafers 14 are carried by the tongues 22, operation of the second cylinder unit 26 is then stopped and the first cylinder unit 23 is again operated so that the replacing member 20 having the wafers 14 carried thereon is moved in the rightward direction in FIG. 6 to feed the wafers 14 into the holding frame 13. As a result, peripheral portions of the wafers 14 are fitted into the grooves 15 formed in the rods 13a, 13b, 13c, 13d which constitute the holding frame 13. Subsequently, the second cylinder unit 26 is operated in the opposite direction to slightly lower the replacing member 20. As a result, the wafers 14 are left on the holding frame 13 with their peripheral portions supported in the grooves 15 of the holding frame 13, and thus the wafers 14 are transferred from within the cassette 18 into the holding frame 13.

Thereafter, the first cylinder unit 23 and the second cylinder unit 26 are operated in the respective opposite directions to return the replacing member 20 to an initial position, i.e., the position shown in FIG. 2.

Subsequently, the arm piece 17b of the other one of the feeding members 17 is pivoted by an angle of substantially 90° in a similar manner and the rod 10 is rotated to position the cassette 18 adjacent a lower half of the holding frame 13. A similar sequence of operations is then followed to replace the wafers 14 into the holding frame 13. Consequently, the holding frame 13 now holds therein the wafers 14 of the two cassettes 18.

In this condition, the rod 10 is again rotated by energization of the motor to lift the table 11 until the lid member 12 closes the opening 4. As a result, the holding frame 13 which holds the wafers 14 therein is loaded into the chamber 5 in a sealed-up condition. In this condition, the interior of the chamber 5 is brought to a vacuum state and a high frequency voltage is applied to effect plasma processing for a predetermined period of time.

When the intended plasma processing is completed, the rod 10 is rotated in the reverse direction to lower the holding frame 13 by a distance corresponding to substantially one-half of the length of the holding frame 13 so that the lower half of the holding frame 13 may be opposed to the emptied cassette 18. The first and second cylinder units 23, 26 are then operated to replace the wafers 14 held in the lower half of the holding frame 13 into the cassette 18 by means of the replacing member 20, whereafter the cassette 18 is returned to the initial position thereof by means of the feeding member 17 in order to thereafter feed the cassette in a subsequent process.

After completion of the foregoing operation, the rod 10 is again rotated to further lower the holding frame 13 and a similar sequence of operations is followed to replace the wafers 14 remaining in the upper half of the holding frame 13 into the other cassette 18, and thereafter the cassette 18 is returned to its initial position by means of the feeding member 17 in order to thereafter feed the cassette in the same subsequent process.

The intended plasma processing process is thus completed in the foregoing manner.

Figure 7:
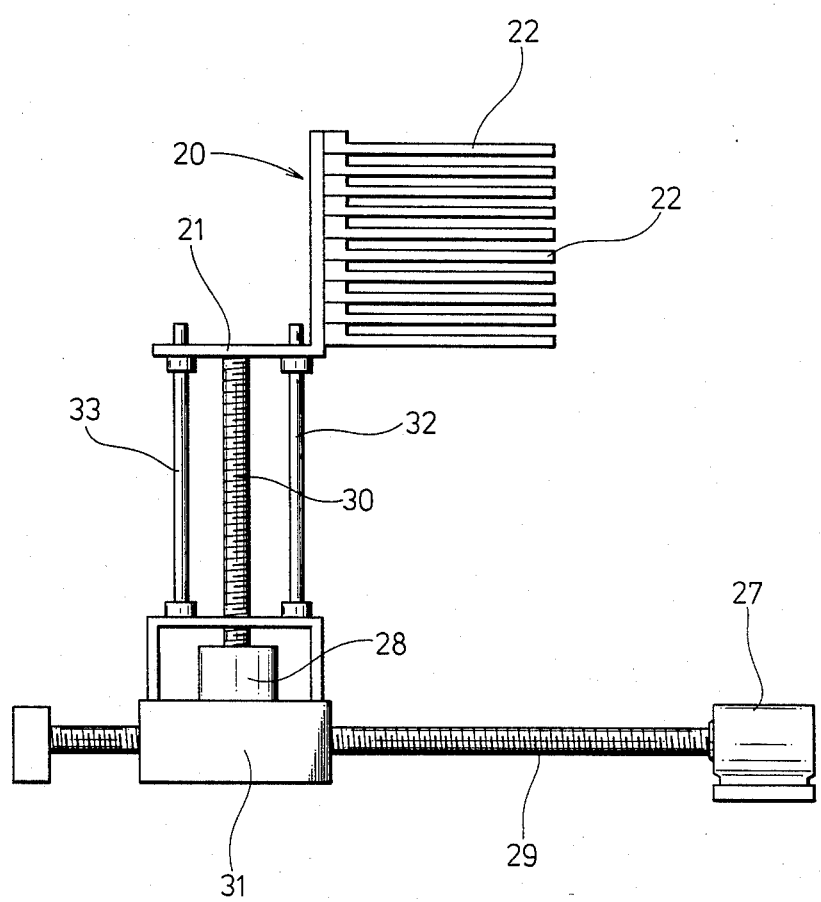
FIG. 7 is a side elevational view showing a modified form of an operating mechanism for the replacing member.

With reference to FIG. 7, there is shown a modified form of a mechanism for operating the replacing member 20 according to the present invention. This modified mechanism employs motors 27, 28 and rods 29, 30 which have external threads formed thereon and are connected to be rotated by the motors 27, 28, respectively, instead of the first and second cylinder units 23, 26 of the first embodiment.

In particular, the first motor 27 is secured to the bottom wall of the body 1 and is connected so as to rotate the first horizontally disposed rod 29 which is threadedly fitted in the support table 31. The second motor 28 is mounted on the support table 31 and is connected so as to rotate the second rod 30 which is fitted in the replacing member 20.

When the motor 27 is energized, the support table 31 and the replacing member 20 are moved in the forward or rearward direction (in the leftward or rightward direction in FIG. 7). On the other hand, when the motor 28 is energized, the replacing member 20 is moved in the upward or downward direction along guide rods 32, 33. It will be understood that such operations of the device as described hereinabove with reference to FIGS. 1-6 can also be attained by the modified mechanism of FIG. 7. Further, a sequence of operations as described hereinabove is attained by means of a fully automatic or semi-automatic control system (not shown).

It is to be noted that the foregoing description relates to but one preferred embodiment of the present invention and that the invention is not limited to the embodiment illustrated in the drawings and described hereinabove. For example, while in the foregoing embodiment the wafer holding frame 13 is loaded into and unloaded from the chamber 5 through the bottom of the chamber 5, a modified chamber which is open at the top thereof may alternatively be employed whereby the holding frame is loaded into and unloaded from the modified chamber through the top of the chamber. Further, while the automatic plasma processing device of the foregoing embodiment can process with plasma wafers in two cassettes at the same time, it may be modified such that wafers in only a single cassette are processed therein.

Further, in the above-described embodiment of the invention the automatic plasma processing device may be provided in the form of a treatment device which has, instead of the plasma generating and heating mechanism including the plasma processing chamber, a treatment mechanism of any conventional type adapted for treatments including at least heating. In such event, it is preferable to provide a fan above a heat treatment chamber in the body of the device so as to heat the chamber evenly.

Although there have been described what are at present considered to be the preferred embodiments of the present invention, it will be understood that the invention may be embodied in other specific forms without departing from the spirit or essential characteristics thereof. The present embodiments are therefore to be considered in all respects as illustrative, and not restrictive. The scope of the invention is indicated by the appended claims rather than by the foregoing description.

We claim:

1. An automatic plasma processing device for processing a batch of semiconductor wafers, comprising:
   at least one cassette member adapted to contain therein a batch including a plurality of said semiconductor wafers in a predetermined spaced relation in substantially the vertical direction;
   feeding means for feeding said cassette member from at least one predetermined position in which said wafers are loaded into said cassette member to a second predetermined position in which said wafers are taken out from said cassette member;

unloading means for simultaneously taking out said batch of semiconductor wafers in said predetermined vertically spaced relation from said cassette member placed at said second position;

a holding member operable for simultaneously receiving said batch of wafers from said unloading means and for holding said batch of semiconductor wafers therein in said predetermined vertically spaced relation;

driving means for driving said holding member to move in a substantially vertical direction;

a plasma chamber disposed in a substantially vertical direction such that said holding member may be moved in the vertical direction into and out of said plasma chamber;

plasma generating means for generating plasma in said plasma chamber in order to effect plasma processing of said batch of semiconductor wafers with the plasma thus generated; and control means for controlling said feeding means, said unloading means, said driving means and said plasma generating means in accordance with a predetermined sequence.

2. An automatic plasma processing device according to claim 1, wherein:

said unloading means takes out said wafers after processing with plasma from said holding member and returns said wafers into said cassette member placed at said second position; and said feeding means returns said cassette member from said second position to said first position.

3. An automatic plasma processing device according to claim 1 or 2, wherein:

said first and second positions are in substantially the same horizontal plane; and said feeding means includes at least one horizontally pivotal member on which said cassette member can be placed, and a driving mechanism operable for pivotally positioning said horizontally pivotal member.

4. An automatic plasma processing device according to claim 3, further comprising:

at least one pair of said cassette members;

a pair of said horizontally pivotal members each for feeding either one of said cassette members; and said pair of said horizontally pivotal members having a pair of said first positions and a pair of said second positions.

5. An automatic plasma processing device according to claim 1 or 2, wherein:

said cassette member includes a pair of substantially vertical parallel plates fixed relative to each other; and a plurality of ribs are formed in said predetermined spaced relationship in said substantially vertical direction on each of opposing ones of surfaces of said parallel plates such that one of said wafers may be received at peripheral portions thereof by opposing ones of said ribs of said parallel plates.

6. An automatic plasma processing device according to claim 5, wherein:

said unloading means includes:

a plurality of tongues disposed in predetermined spaced relationship substantially in the vertical direction such that said tongues can be inserted between said parallel plates of said cassette member and can carry said wafers thereon;

a movable member on which said tongues are mounted to extend in a substantially horizontal direction; and a driving mechanism operable for positioning said movable member in a substantially vertical direction and also in a predetermined substantially horizontal direction which interconnects said second position and said holding member.

7. An automatic plasma processing device according to claim 6, wherein:

said driving mechanism includes:

a table member mounted for movement in said predetermined horizontal direction;

a substantially horizontal drive mechanism for driving said table member in said predetermined horizontal direction; and a substantially vertical drive mechanism securely mounted on said table member for driving said movable member in a substantially vertical direction.

8. An automatic plasma processing device according to claim 7, wherein:

said horizontal and vertical drive mechanisms include power cylinders having the axes thereof disposed in said predetermined horizontal direction and in said vertical direction, respectively.

9. An automatic plasma processing device according to claim 7, wherein:

said horizontal and vertical drive mechanisms each include threaded bar members having the axes thereof disposed in said predetermined horizontal direction and in said vertical direction, respectively, and rotary elements for rotating said threaded bar members, respectively.

10. An automatic plasma processing device according to claim 1 or 2, wherein:

said holding member includes a bottom plate, and four substantially vertical parallel bars having lower ends thereof fixed to said bottom plate; and said four parallel bars each have a plurality of grooves or slits formed in said predetermined spaced relationship in a substantially vertical row therein such that each set comprising four of such grooves of said four different parallel bars may receive therein different peripheral portions of one of said wafers.

11. An automatic plasma processing device according to claim 10, wherein:

a pair of said four parallel bars are disposed adjacent said second position and are spaced from each other by a relatively large distance while the other pair of said four parallel bars are disposed remote from said second position and are spaced from each other by a relatively small distance.

12. An automatic plasma processing device according to claim 10, wherein:

said plasma chamber has an opening which is open downwardly; and said bottom plate of said holding member is operable to seal-up said opening of said plasma chamber.

13. An automatic plasma processing device according to claim 1, wherein:

said plasma chamber is substantially in the form of a cylinder which has a substantially vertical axis.

14. An automatic plasma processing device according to claim 1, further comprising:

heating means for heating said plasma chamber from the outside, said heating means being controlled by said control means.

15. A heat treatment device for treating a batch of thin plate-like works, comprising:
   at least one cassette member adapted to contain therein a batch including a plurality of said thin plate-like works to be treated in a predetermined spaced relation in substantially the vertical direction;
   feeding means for feeding said cassette member from at least one predetermined position in which said works are loaded into said cassette member to a second predetermined position in which said works are taken out from said cassette member;
   unloading means for simultaneously taking out said works in said predetermined vertically spaced relation from said cassette member disposed in said second position;
   a holding member operable for simultaneously receiving said works from said unloading means and for holding said works therein in said predetermined vertically spaced relation;
   driving means for driving said holding member to move in a substantially vertical direction;
   a heat treatment chamber disposed in a substantially vertical direction such that said holding member may be moved in the vertical direction into and out of said heat treatment chamber;
   said heat treatment chamber being adapted for treatment including at least the heating of said batch of works; and
   heating means for heating said treatment chamber from the outside.

16. An automatic heat treatment device for treating a batch of sheet-like treatment objects, comprising:
   a treatment chamber disposed such that an axis thereof extends in a substantially vertical direction;
   heating means disposed on an outer periphery of said treatment chamber;
   a holding member for holding a batch including a plurality of said sheet-like treatment objects in a predetermined spaced relation in substantially the vertical direction, said holding member being adapted to move in a substantially vertical direction between a first predetermined position in which said objects are simultaneously loaded therein and simultaneously unloaded therefrom, and a second predetermined position in which said batch of objects are heat-treated in said treatment chamber; and
   means, operably cooperating with said holding member, for simultaneously loading a plurality of said objects into said holding member in said first predetermined position thereof and simultaneously unloading a plurality of said objects in said predetermined vertically spaced relation from said holding member in said first predetermined position thereof.

17. An automatic heat treatment device according to claim 16, wherein:
   said heating means comprises a high-frequency inductive heating coil.

18. An automatic heat treatment device according to claim 16, wherein:
   said heating means comprises a resistance heating coil.

19. An automatic heat treatment device according to claim 16, wherein:
   said heating means comprises a heating lamp, 20. An automatic heat treatment device according to claim 16, wherein:
   said treatment chamber is substantially cylindrical and opening downwardly; and
   said holding member is moved substantially in the vertical direction into and out of said treatment chamber through said opening.

21. An automatic heat treatment device according to claim 16, wherein:
   said treatment chamber is substantially cylindrical and opening upwardly; and
   said holding member is moved substantially in the vertical direction into and out of said treatment chamber through said opening.

22. An automatic plasma processing device according to claim 1, wherein:
   said plasma chamber has an opening which is open upwardly; and
   said holding member is moved substantially in the vertical direction into and out of said plasma chamber through said opening.

* * * * *